United States Patent
Hsieh et al.

(10) Patent No.: US 9,379,076 B2
(45) Date of Patent: Jun. 28, 2016

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Chen-Chih Hsieh, Miaoli County (TW); Hao-Yi Tsai, Hsinchu (TW); Chao-Wen Shih, Hsinchu County (TW); Yung-Ping Chiang, Hsinchu County (TW); Tsung-Yuan Yu, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/503,795

(22) Filed: Oct. 1, 2014

(65) Prior Publication Data
US 2016/0099223 A1  Apr. 7, 2016

(51) Int. Cl.
| | |
|---|---|
| H01L 23/31 | (2006.01) |
| H01L 23/544 | (2006.01) |
| H01L 21/78 | (2006.01) |
| H01L 23/00 | (2006.01) |
| H01L 23/522 | (2006.01) |
| H01L 23/528 | (2006.01) |
| H01L 21/56 | (2006.01) |
| H01L 21/768 | (2006.01) |

(52) U.S. Cl.
CPC ............... *H01L 24/13* (2013.01); *H01L 21/56* (2013.01); *H01L 21/565* (2013.01); *H01L 21/76877* (2013.01); *H01L 23/3171* (2013.01); *H01L 23/528* (2013.01); *H01L 23/5226* (2013.01); *H01L 24/11* (2013.01); *H01L 2224/1132* (2013.01); *H01L 2224/11848* (2013.01); *H01L 2224/13147* (2013.01); *H01L 2224/13155* (2013.01)

(58) Field of Classification Search
CPC ............... H01L 2224/034; H01L 2924/01047; H01L 2224/13147
USPC ........................................................ 438/113
See application file for complete search history.

(56) References Cited

U.S. PATENT DOCUMENTS

| | | | |
|---|---|---|---|
| 2007/0269973 A1* | 11/2007 | Nalla | H01L 24/11 438/612 |
| 2013/0093077 A1* | 4/2013 | Liang | H01L 23/3192 257/737 |

* cited by examiner

*Primary Examiner* — Evan Pert
*Assistant Examiner* — Changhyun Yi
(74) *Attorney, Agent, or Firm* — WPAT, P.C. Intellectual Property Attorneys; Anthony King

(57) ABSTRACT

A method of manufacturing a semiconductor structure includes receiving a substrate including a die pad disposed thereon; disposing a passivation over the substrate and around the die pad; disposing a polymer over the passivation; forming a post passivation interconnect (PPI) including an elongated portion and a via portion contacting with the die pad; depositing a metallic paste on the elongated portion of the PPI by a stencil; disposing a conductive bump over the metallic paste; and disposing a molding over the PPI and around the metallic paste and the conductive bump.

20 Claims, 9 Drawing Sheets

SEMICONDUCTOR DEVICE AND MANUFACTURING METHOD THEREOF

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a wafer level packaging (WLP) is widely used for its low cost and relatively simple manufacturing operations. During the WLP operation, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. The semiconductor device is assembled with numbers of integrated components including various materials with difference in thermal properties. As such, the integrated components are in undesired configurations after curing of the semiconductor device. The undesired configurations would lead to yield loss of the semiconductor device, poor electrical interconnection, development of cracks or delamination of the components, etc. Furthermore, the components of the semiconductor device includes various metallic materials which are in limited quantity and thus in a high cost. The undesired configurations of the components and the yield loss of the semiconductor would further exacerbate materials wastage and thus the manufacturing cost would increase.

Since more different components with different materials are involved, a complexity of the manufacturing operations of the semiconductor device is increased. There are more challenges to modify a structure of the semiconductor device, improve the manufacturing operations and minimize materials usage. As such, there is a continuous need to improve the manufacturing the semiconductor and solve the above deficiencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
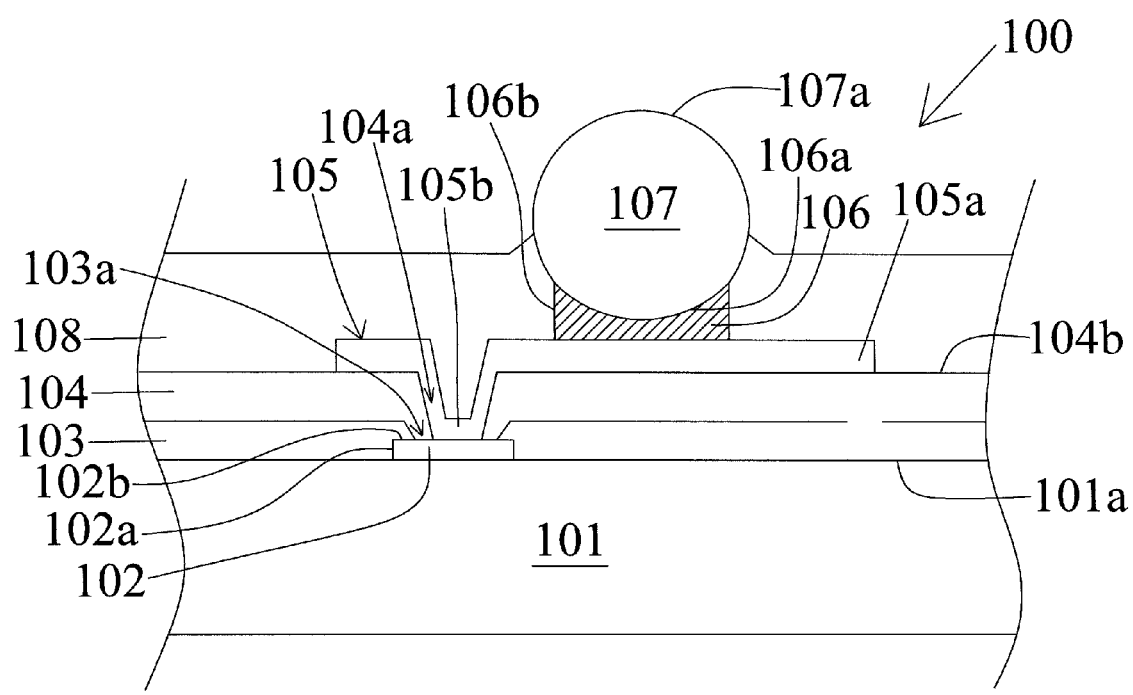
FIG. 1 is a schematic view of a semiconductor device structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor structure is manufactured by a number of operations. During the manufacturing, a post passivation interconnect (PPI) is disposed over a substrate for routing a die pad of the substrate, and a conductive bump is disposed on a portion of the post passivation interconnect (PPI). The substrate has to be aligned or calibrated to a correct position and orientation prior to mounting of the conductive bump on the PPI. After the alignment operation, the conductive bump is dropped and mounted on the PPI. The conductive bump has to be placed at an appropriate position of the PPI. After the reflow operation, the conductive bump is configured for electrically connecting with another substrate or device.

The conductive bump is placed on the PPI after the alignment operation. However, as the conductive bump is in substantially spherical shape, the conductive bump would be displaced from the appropriate position easily during the mounting operation. Furthermore, the conductive bump would shift during the reflow operation. Finally, the conductive bump does not seat at the appropriate and desired position. As the conductive bump is configured for bonding with a bond pad on another substrate, malposition of the conductive bump on PPI would affect subsequent operations. The conductive bump would not be able to bond with a bond pad of another substrate accurately, and ultimately the substrate would be poorly bonded with another substrate. A high yield loss and a poor reliability on the electrical connection between the conductive bump and the bond pad would be suffered.

In the present disclosure, a semiconductor structure with a structural improvement is disclosed. The semiconductor structure includes a metallic paste disposed on a predetermined position of a post passivation interconnect (PPI). The metallic paste serves as a landing pad for a conductive bump seating thereon. The conductive bump can mount on the PPI at where the metallic paste positioned. The conductive bump would form on the appropriate position of the PPI. The mounting of the conductive bump on the PPI is under control, which would minimize shifting of the conductive bump and improve reliability of the semiconductor structure. Also, the metallic paste is intermediate between the conductive bump and the PPI. Therefore, electron migration from the PPI to the conductive bump can be avoided, and thus formation of void or development of cracks within the PPI can also be avoided.

FIG. 1 is an embodiment of a semiconductor structure 100 in accordance with various embodiments of the present disclosure. The semiconductor structure 100 includes a substrate 101, a die pad 102, a passivation 103, a polymer 104, a post passivation interconnect (PPI) 105, a metallic paste 106, a conductive bump 107 and a molding 108.

In some embodiments, the substrate 101 is a piece including semiconductor materials such as silicon germanium, gallium, arsenic, and combinations thereof. A predetermined functional circuit is fabricated over the substrate 101 by various methods such as photolithography operations, etching or etc. In some embodiments, the substrate 101 includes several electrical circuits formed within the substrate 101 for a particular application. In some embodiments, the electrical circuits include various n-type metal-oxide semiconductor (NMOS) and/or p-type metal-oxide semiconductor (PMOS) devices such as transistors, capacitors, resistors, diodes and/or the like. In some embodiments, the electrical circuits are interconnected to perform one or more functions such as memory, sensors, amplifiers, input/output circuitry and/or the like.

In some embodiments, the substrate 101 includes a layer of a semiconductor material such as silicon, germanium and/or the like formed over an insulator layer such as buried oxide formed in the substrate. In some embodiments, the substrate 101 is multi-layered substrates, gradient substrates, hybrid orientation substrates, any combinations thereof and/or the like. In some embodiments, the substrate 101 is in a quadrilateral, a rectangular or a square shape.

The die pad 102 is disposed over the substrate 101. In some embodiments, the die pad 102 is electrically connected with a circuitry external to the substrate 101, so that a circuitry internal to the substrate 101 electrically connects with the circuitry external to the substrate 101 through the die pad 102.

In some embodiments, the die pad 102 is configured for receiving a conductive trace coupled with a conductive bump, so that the substrate 101 electrically connects with a circuitry external to the substrate 101 through the die pad 102, the conductive trace and the conductive bump. In some embodiments, the die pad 102 includes gold, silver, copper, nickel, tungsten, aluminum, palladium and/or alloys thereof.

The passivation 103 is disposed over the substrate 101 and surrounds an edge 102a of the die pad 102. In some embodiments, the passivation 103 is disposed on a surface 101a of the substrate 101. In some embodiments, the passivation 103 partially covers a top surface 102b of the die pad 102. The passivation 103 is configured for providing an electrical insulation and a moisture protection for the substrate 101, so that the substrate 101 is isolated from ambient environment.

In some embodiments, the passivation 103 is formed with dielectric materials such as spin-on glass (SOG), silicon oxide, silicon oxynitride, silicon nitride or the like. In some embodiments, the passivation 103 is formed with a vapor deposition or a spin coating process.

In some embodiments, the passivation 103 includes a first opening 103a above the die pad 102 for exposing a portion of the top surface 102b of the die pad 102, and thus for electrically connecting the die pad 102 with the circuitry external to the substrate 101 through the conductive trace. In some embodiments, the first opening 103a is tapered towards the top surface 102b of the die pad 102.

The polymer 104 is disposed over the passivation 103. In some embodiments, some of the polymer 104 is disposed within the first opening 103a of the passivation 103. Some of the polymer 104 is conformal to the first opening 103a. In some embodiments, the polymer 104 includes a polymeric material such as epoxy, polyimide, polybenzoxazole (PBO), benzocyclobutene (BCB) or etc.

In some embodiments, the polymer 104 includes a second opening 104a. In some embodiments, the second opening 104a is surrounded by the first opening 103a of the passivation 103. The second opening 104a is within the first opening 103a. In some embodiments, the second opening 104a is tapered towards the top surface 102b of the die pad 102. In some embodiments, the second opening 104a is conformal to a profile of the first opening 103a.

The post passivation interconnect (PPI) 105 is disposed on the polymer 104. The PPI 105 re-routes a path of a circuit from the die pad 102. In some embodiments, the PPI 105 is a single material layer or a multi-layered conductive structure. In some embodiments, the PPI 105 includes copper, aluminum, titanium, titanium nitride, copper alloy or other mobile conductive materials.

In some embodiments, the PPI 105 includes an elongated portion 105a and a via portion 105b. The elongated portion 105a is coupled with the via portion 105b. In some embodiments, the elongated portion 105a extends horizontally along a surface 104b of the polymer 104. A portion of the elongated portion 105a is configured for receiving a conductive structure to connect with an external circuit or another substrate.

In some embodiments, the via portion 105b is extended from the surface 104b of the polymer 104 to contact with the die pad 102. The die pad 102 exposed from the passivation 103 and the polymer 104 is contacted with the via portion 105b. Thus, the elongated portion 105a is electrically connected with the die pad 102 via the via portion 105b. In some embodiments, the via portion 105b of the PPI 105 is disposed within the first opening 103a of the passivation 103 and the second opening 104a of the polymer 104. In some embodiments, the via portion 105b is conformal to a profile of the second opening 104a. In some embodiments, the via portion 105b is in a V shape.

The metallic paste 106 is disposed on the elongated portion 105a of the PPI 105. The metallic paste 106 is disposed at a predetermined position of the elongated portion 105a and serves as a landing pad for a conductive structure subsequently disposed thereon. In some embodiments, the metallic paste 106 includes a concavity 106a for receiving a conductive structure. In some embodiments, the concavity 106a is curved towards the PPI 105 and the substrate 101. A curvature of the concavity 106a corresponds to a profile of an outer surface of the conductive structure to be disposed thereon.

In some embodiments, the metallic paste 106 is a mixture of a metal and an adhesive. In some embodiments, the metallic paste 106 includes copper or nickel. In some embodiments, a thickness of the metallic paste 106 is about 10 um to about 50 um.

The conductive bump 107 is disposed over the metallic paste 106. In some embodiments, the conductive bump 107 is received by the metallic paste 106. A portion of an outer surface 107a of the conductive bump 107 is contacted and coupled with the concavity 106a of the metallic paste 106. In some embodiments, a diameter of the conductive bump 107 is substantially same as a width of an interface between the metallic paste 106 and the PPI 105.

In some embodiments, the concavity 106a of the metallic paste 106 is conformal to a portion of the outer surface 107a of the conductive bump 107. The conductive bump 107 is held by the concavity 106a of the metallic paste 106. As such, the conductive bump 107 would not shift or displace from the metallic paste 103 or a predetermined position of the elongated portion 105a of the PPI 105.

In some embodiments, the conductive bump 107 is configured for bonding with a bond pad of another substrate, thereby an electrical connection is established between the substrate 101 and another substrate. In some embodiments, the conductive bump 107 is in a spherical shape as a solder ball or in a cylindrical shape as a pillar. In some embodiments, the conductive bump 107 is a solder ball, a solder bump, a solder paste or etc. In some embodiments, the conductive bump 107 has a cross sectional surface in circular, quadrilateral or polygonal shape. In some embodiments, the conductive bump 107 includes metals such as lead, tin copper, gold, nickel, etc. or metal alloy such as combination of lead, tin copper, gold, nickel, etc.

The molding 108 is disposed over the polymer 104 and the PPI 105. In some embodiments, the molding 108 surrounds the conductive bump 107 and the metallic paste 106. In some embodiments, the molding 108 is disposed around a portion of the outer surface 107a of the conductive bump 107. The conductive bump 107 is partially encapsulated by the molding 108. A top portion of the outer surface 107a of the conductive bump 107 is exposed from the molding 107.

In some embodiments, an edge 106b of the metallic paste 106 is surrounded by the molding 108. The molding 108 covers the metallic paste 106, the PPI 105 and the polymer 104.

In some embodiments, the molding 108 is formed with composite materials including epoxy resins, phenolic hardeners, silicas, catalysts, pigments and mold release agents. In some embodiments, the molding 108 has a high thermal conductivity, a low moisture absorption rate, a high flexural strength at board-mounting temperatures, or a combination of these. In some embodiments, the molding 108 is a liquid molding compound (LMC).

Figure 2:
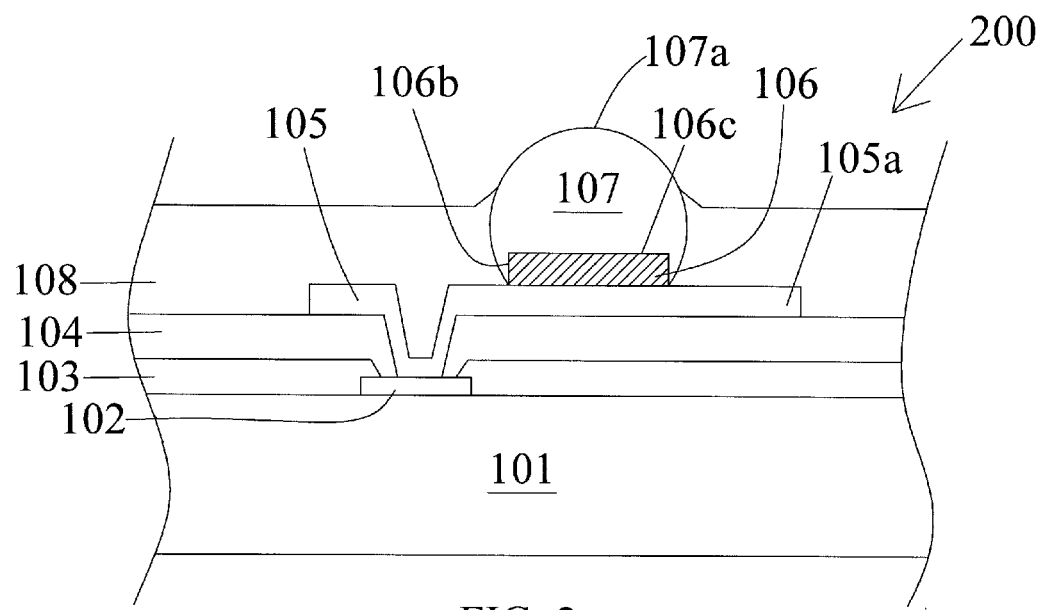
FIG. 2 is a schematic view of a semiconductor device structure with a metallic paste wholly covered by a conductive bump in accordance with some embodiments of the present disclosure.

FIG. 2 is another embodiment of a semiconductor structure 200 in accordance with various embodiments of the present disclosure. The semiconductor structure 200 includes a substrate 101, a die pad 102, a passivation 103, a polymer 104, a post passivation interconnect (PPI) 105, a conductive bump 107, a metallic paste 106 and a molding 108, which are in similar configuration as in FIG. 1.

In some embodiments, the metallic paste 106 is covered and encapsulated by the conductive bump 107. An edge 106b and a top surface 106c of the metallic paste 106 is contacted with the conductive bump 107.

Figure 3:
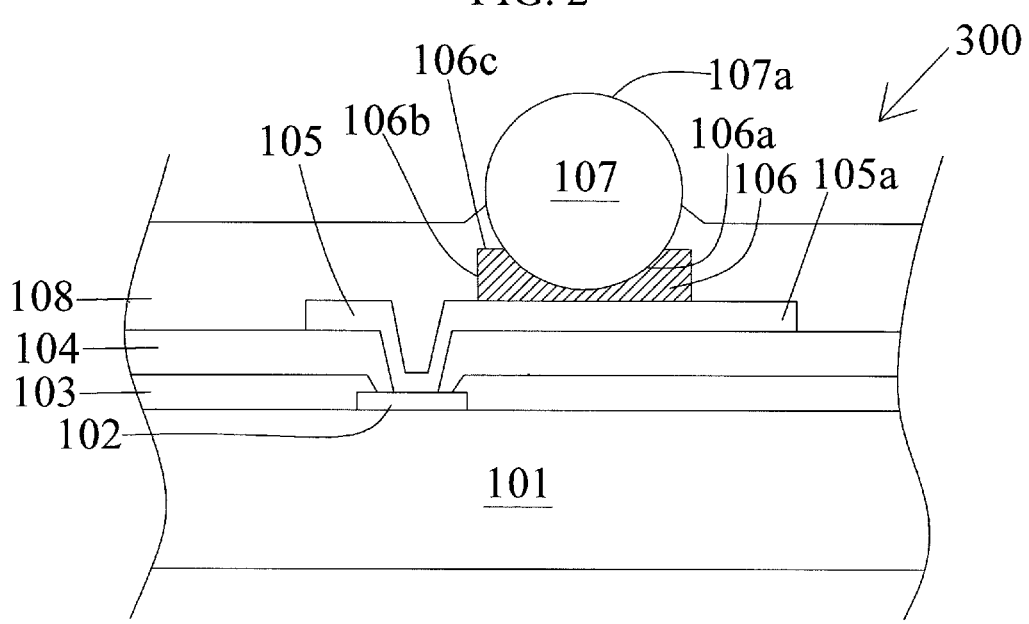
FIG. 3 is a schematic view of a semiconductor device structure with a metallic paste including a concavity in accordance with some embodiments of the present disclosure.

FIG. 3 is another embodiment of a semiconductor structure 300 in accordance with various embodiments of the present disclosure. The semiconductor structure 300 includes a substrate 101, a die pad 102, a passivation 103, a polymer 104, a post passivation interconnect (PPI) 105, a conductive bump 107, a metallic paste 106 and a molding 108, which are in similar configuration as in FIG. 1.

In some embodiments, a width of the metallic paste 106 is greater than a diameter of the conductive bump 107. As such, a concavity 106a is contacted with a portion of the outer surface 107a of the conductive bump, and an edge 106b and a top surface 106c of the metallic paste are contacted with the molding 108.

Figure 4:
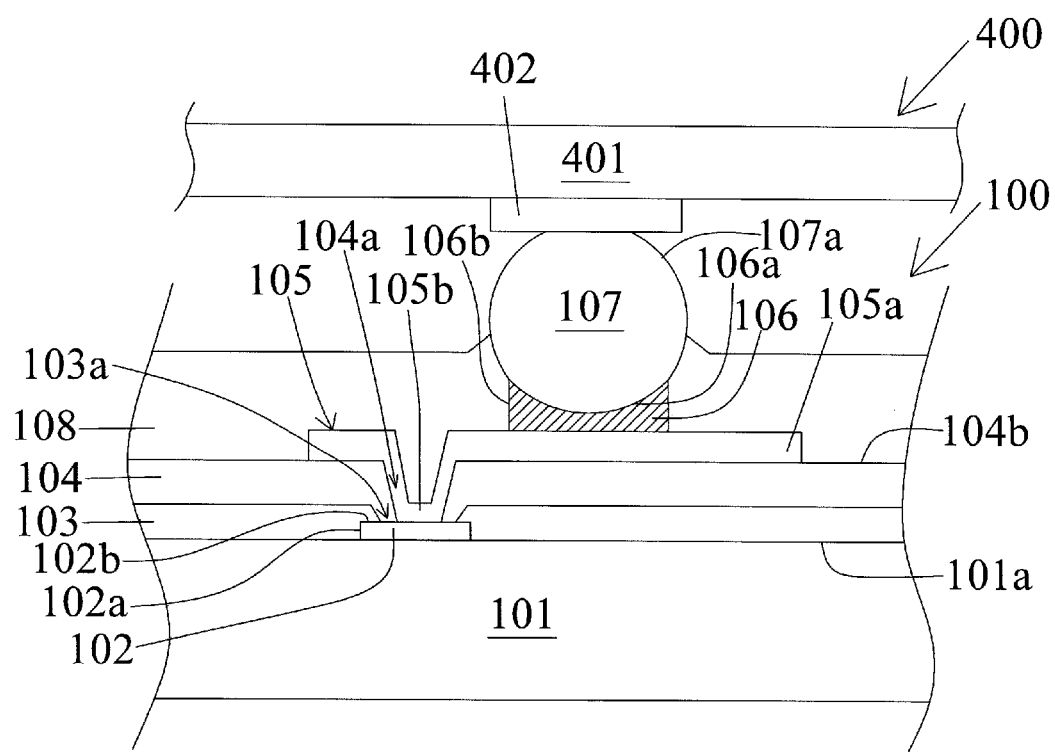
FIG. 4 is a schematic view of a semiconductor device structure bonding with another substrate in accordance with some embodiments of the present disclosure.

FIG. 4 shows the semiconductor structure 100 bonded with another semiconductor structure 400. The semiconductor structure 400 includes a substrate 401 and a bond pad 402. In some embodiments, the semiconductor structure 100 is mounted on the semiconductor structure 400 by bonding the conductive bump 107 of the semiconductor structure 100 with the bond pad 402 of the semiconductor structure 400. The conductive bump 107 is attached with the bond pad 402, so that the circuit within the substrate 101 of the semiconductor structure 100 is electrically connected with the circuit within the substrate 401 of the semiconductor structure 400 through the die pad 102, the PPI 105, the conductive bump 107 and the bond pad 402.

In some embodiments, the semiconductor structure 100 is boned with the semiconductor structure 400 to become a semiconductor package as a final product or as an intermediate product for subsequent operations. In some embodiments, when both semiconductor structures 100 and 400 are a package respectively, a package on package (PoP) is formed.

In the present disclosure, a method of manufacturing a semiconductor structure is also disclosed. In some embodiments, a semiconductor structure is formed by a method 500. The method 500 includes a number of operations and the description and illustration are not deemed as a limitation as the sequence of the operations.

Figure 5:
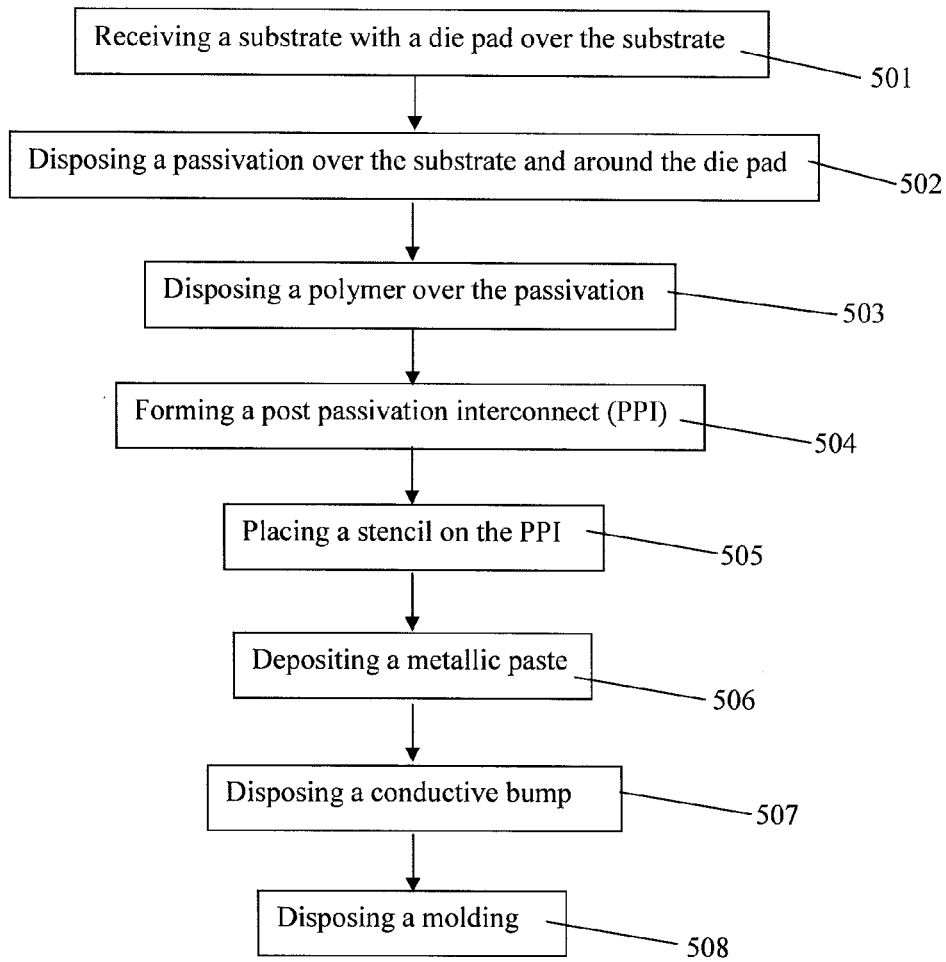
FIG. 5 is a flow diagram of a method of manufacturing a semiconductor structure in accordance with some embodiments.

FIG. 5 is an embodiment of a method 500 of manufacturing a semiconductor structure. The method 300 includes a number of operations (501, 502, 503, 504, 505, 506, 507 and 508).

Figure 6A:
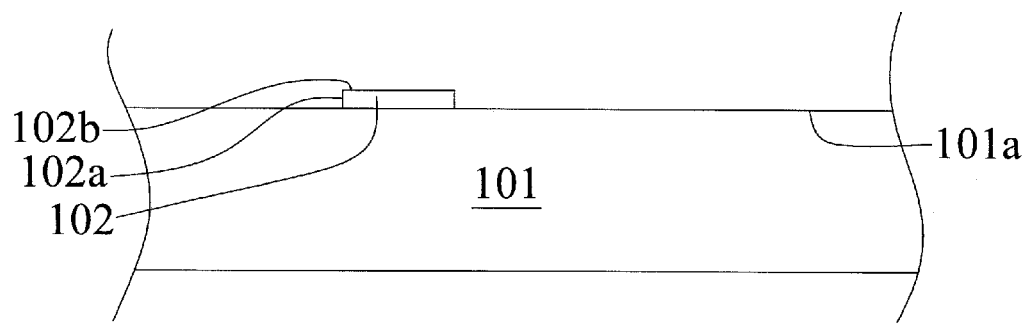
FIG. 6A is a schematic view of a substrate in accordance with some embodiments.

In operation 501, a substrate 101 including a die pad 102 is received or provided as in FIG. 6A. In some embodiments, the substrate 101 includes silicon, ceramic, copper or etc. In some embodiments, the die pad 102 is disposed on or over the substrate 101. The die pad 102 is configured for connecting a circuitry within the substrate 101 with an external circuitry or an external device.

Figure 6B:
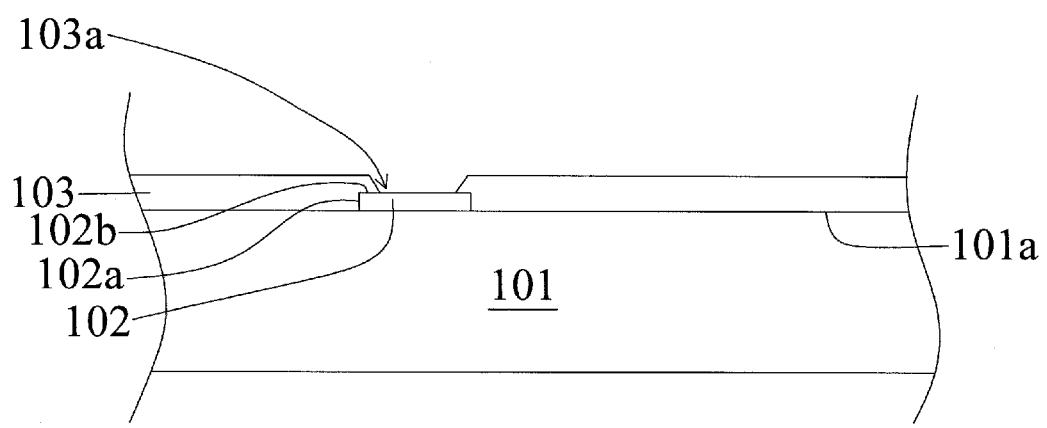
FIG. 6B is a schematic view of a substrate with a passivation in accordance with some embodiments.

In operation 502, a passivation 103 is disposed over the substrate 101 and around the die pad 102 as in FIG. 6B. In some embodiments, the passivation 103 covers a surface 101a of the substrate 101 and an edge 102a of the die pad 102, while a portion of a top surface 102b of the die pad 102 is exposed from the passivation 103. In some embodiments, a first opening 103a is formed above the die pad 102 upon disposing the passivation 103. Some of the passivation 103 adjacent to the die pad 102 is removed to form the first opening 103a.

Figure 6C:
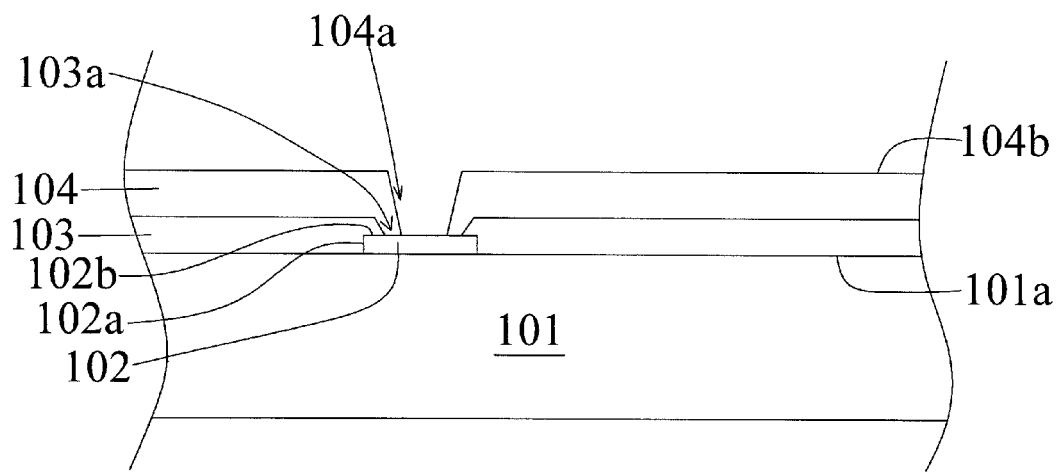
FIG. 6C is a schematic view of a substrate with a polymer in accordance with some embodiments.

In operation 503, a polymer 104 is disposed over the passivation 103 as in FIG. 6C. In some embodiments, the polymer 104 is disposed on the passivation 103 and within the first opening 103a. A portion of the passivation 103 is conformal to a profile of the first opening 103a. In some embodiments, a second opening 104a is formed above the die pad 102 upon disposing the polymer 104. In some embodiments, some of the polymer 104 adjacent to the first opening 103a is removed to form the second opening 104a. In some embodiments, the second opening 104a is within the first opening 103a.

In some embodiments, the polymer 104 includes a polymeric material such as epoxy, polyimide, polybenzoxazole (PBO), benzocyclobutene (BCB) or etc. In some embodiments, the polymer 104 is disposed by spin coating or other suitable operations.

Figure 6D:
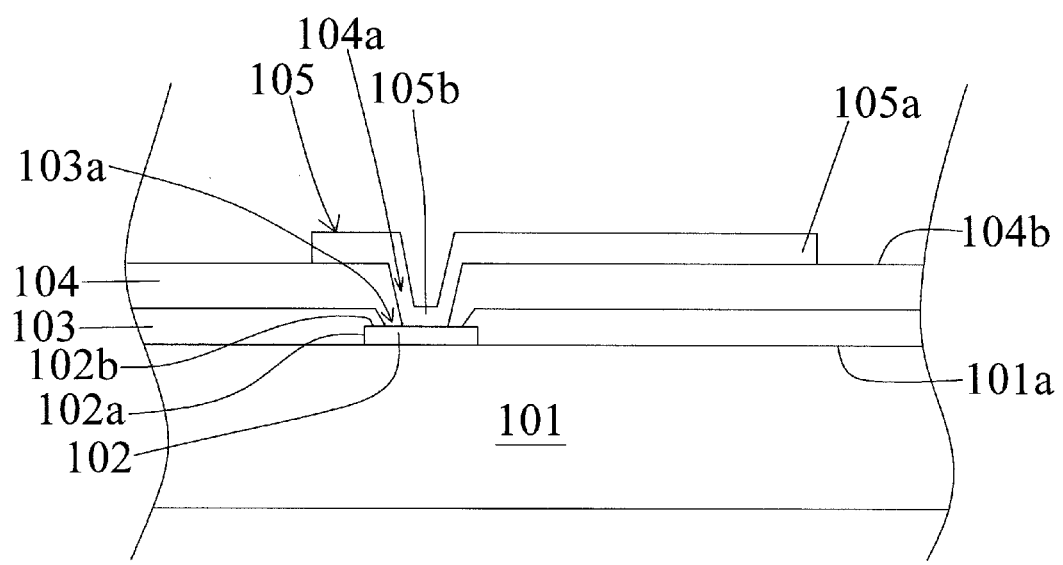
FIG. 6D is a schematic view of a substrate with a post passivation interconnect (PPI) in accordance with some embodiments.

In operation 504, a post passivation interconnect (PPI) 105 is formed over the polymer 104 as in FIG. 6D. In some embodiments, the PPI 105 is electrically connected to the die pad 102. In some embodiments, the PPI 105 includes an elongated portion 105a and a via portion 105b contacting with the die pad 102. In some embodiments, the elongated portion 105a is disposed on a surface 104b of the polymer 104, and the via portion 105b is disposed within the first opening 103a of the passivation 103 and the second opening 104a of the polymer 104. The via portion 105b is conformal to a profile of the second opening 104a. The via portion 105b is surrounded by the first opening 103a and the second opening 104a. In some embodiments, the PPI 105 is formed by electroplating, sputtering or any other suitable operations.

Figure 6E:
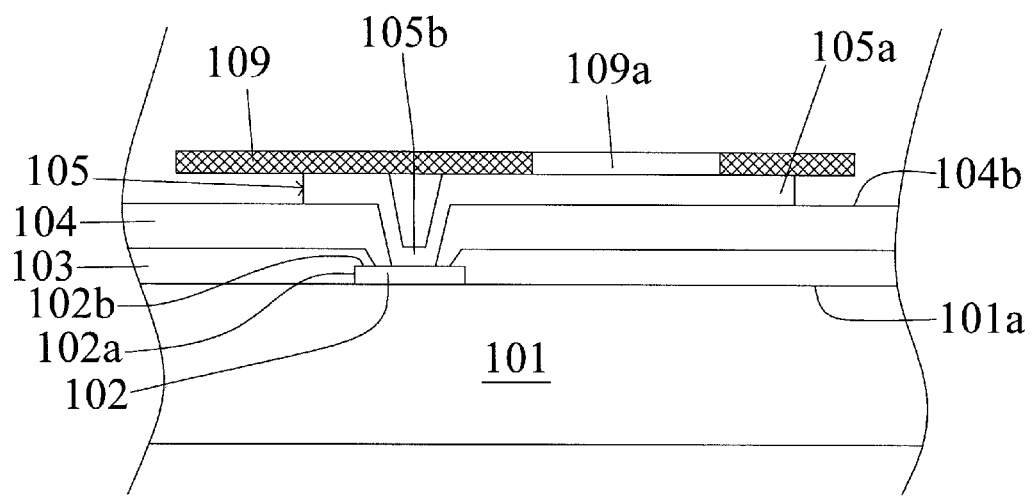
FIG. 6E is a schematic view of a stencil placed over a PPI in accordance with some embodiments.

In operation 505, a stencil 109 is placed on or over the PPI 105 as in FIG. 6E. In some embodiments, the stencil 109 includes an aperture 109a. In some embodiments, the aperture 109a is configured for receiving a metallic paste or a conductive bump in subsequent operation. In some embodiments, the aperture 109a corresponds to a predetermined position of the elongated portion 105a of the PPI 105, thereby a metallic paste subsequently disposed on the elongated portion 105a would be at the predetermined position in accordance with a position of the aperture 109a the stencil 109. In some embodiments, a width of the aperture 109a of the stencil 109 is about 100 um to about 300 um. In some embodiments, a width of the aperture 109a is about 150 um to about 180 um.

Figure 6F:
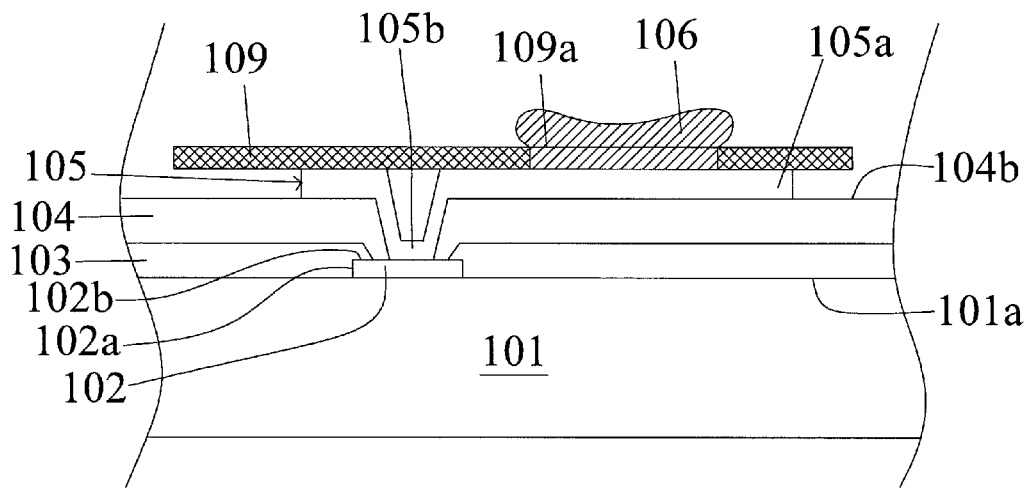
FIG. 6F is a schematic view of a metallic paste filled an aperture of a stencil in accordance with some embodiments.

In operation 506, a metallic paste 106 is deposited on the elongated portion 105a of the PPI 105 by the stencil 109 as in FIG. 6F. In some embodiments, the metallic paste 106 includes a metal and an adhesive. In some embodiments, the metallic paste 106 includes copper or nickel.

Figure 6G:
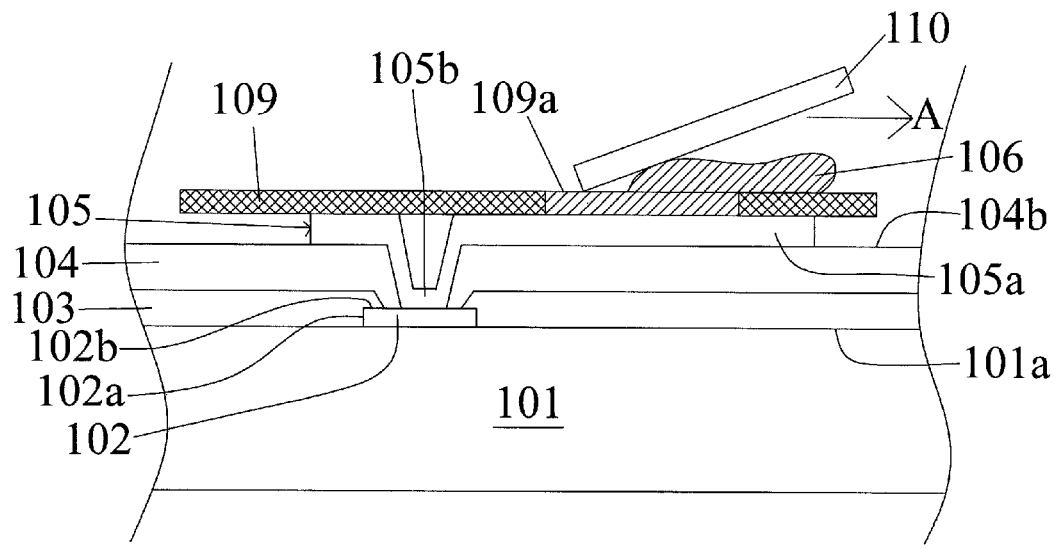
FIG. 6G is a schematic view of a blade for removing an overflown metallic paste in accordance with some embodiments.

In some embodiments, the metallic paste 106 is deposited by placing the stencil 109 on the PPI 105 and filling the aperture 109a of the stencil 109. The metallic paste 106 is deposited by screen printing operations over the stencil 109. The aperture 109a of the stencil 109 is completely filled with the metallic paste 106 by removing the metallic paste 106 overflown from the aperture 109a as in FIG. 6G. The overflown metallic paste 106 is removed by sweeping a blade 110 across the semiconductor structure (along a direction as arrow A) over the stencil 109.

In some embodiments, the metallic paste 106 is wholly or partially cured before subsequent operations. In some embodiments, the metallic paste 106 is cured at a temperature of about 80° C. to about 150° C.

Figure 6H:
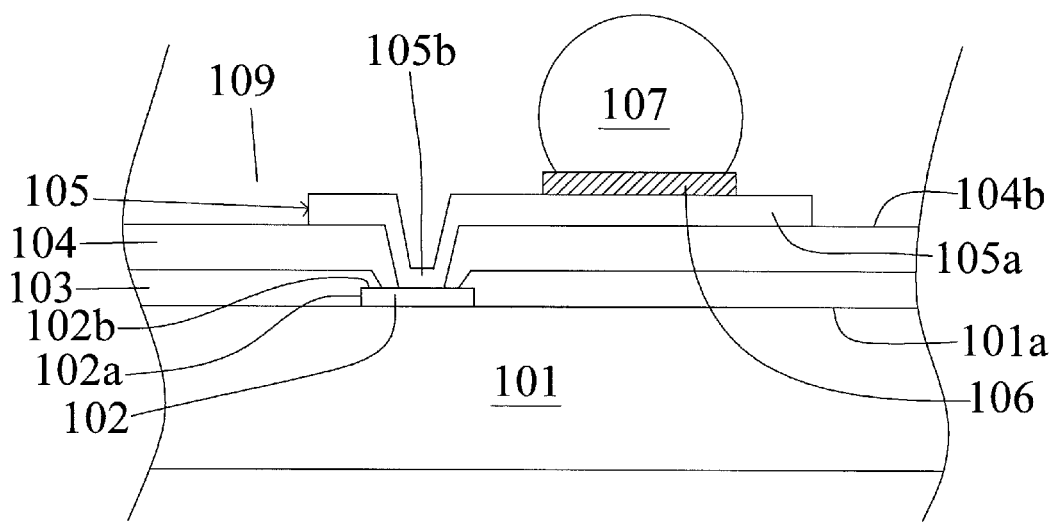
FIG. 6H is a schematic view of a substrate with a conductive bump in accordance with some embodiments.

In operation 507, a conductive bump 107 is disposed over the metallic paste 106 as in FIG. 6H. The conductive bump 107 is electrically connected with the die pad 102 through the PPI 105. The conductive bump 107 is configured for bonding with a bond pad of another substrate, thereby electrically connecting the substrate 101 with another substrate. As a present of the metallic paste 106 at the predetermined position of the elongated portion 105a of the PPI 105, the conductive bump 107 can be disposed at the predetermined position of the PPI 105 without any shifting. The conductive bump 107 can be disposed at a desired position.

In some embodiments, the conductive bump 107 is disposed on the metallic paste 106 before or after curing of the semiconductor structure. In some embodiments, a concavity 106a is formed for receiving the conductive bump 107 when the metallic paste 106 is cured. The metallic paste 106 is facilitated to hold the conductive bump 107, such that the conductive bump 107 would not be shifted from the predetermined position during subsequent operations such as reflowing, curing, etc. In some embodiments, the conductive bump 107 includes metal such as lead, tin copper, gold, nickel, etc. or metal alloy such as combination of lead, tin copper, gold, nickel, etc.

The conductive bump 107 has different reflow temperature from the metallic paste 106. In some embodiments, the conductive bump 107 is a lead (Pb)-containing solder which has a reflow temperature of about 180° C. to about 250° C. In some embodiments, the conductive bump 107 is a lead-free solder which has a reflow temperature of about 220° C. to about 250° C. In some embodiments, the metallic paste 106 has a reflow temperature of about 300° C. to about 800° C. In some embodiments, there is a ratio of the reflow temperature of the conductive bump 107 to the reflow temperature of the metallic paste 106. The ratio is about 1:1.5 to about 1:3.5.

In some embodiments, the stencil 109 is removed before disposing the conductive bump 107. In some embodiments, the conductive bump 107 is disposed on the metallic paste 106 by disposing a photoresist over the PPI 105, forming a pattern on the photoresist by photolithography, plating a solder flux according to the pattern of the photoresist, stripping a remaining photoresist and reflowing the solder flux to form the conductive bump 107.

In some embodiments, the conductive bump 107 is disposed by the stencil 109. The stencil 109 is still placed on the PPI 105. The conductive bump 107 is dropped on the metallic paste 106 in accordance with the position of the aperture 109a. In some embodiments, the stencil 109 is removed after disposing the conductive bump 107.

Figure 6I:
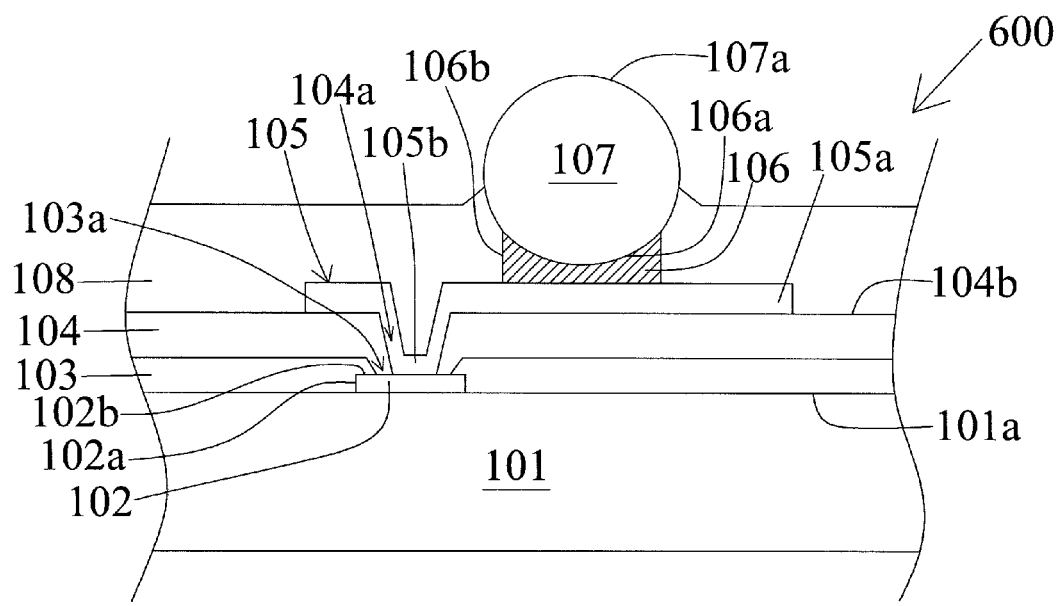
FIG. 6I is a schematic view of a substrate with a molding in accordance with some embodiments.

In operation 508, a molding 108 is disposed over the PPI 105 and around the metallic paste 106 and the conductive bump 107 as in FIG. 6I. In some embodiments, the molding 108 is a liquid molding compound (LMC). In some embodiments, the molding 108 covers the metallic paste 106 and a portion of an outer surface 107a of the conductive bump 107. A portion of an outer surface 107a of the conductive bump 107 is exposed from the molding 108, so that the conductive bump 107 can bond with another substrate in subsequent operation. In some embodiments, the semiconductor structure 600 is formed, which is in similar configuration as the semiconductor structure 100 of FIG. 1.

Figure 6J:
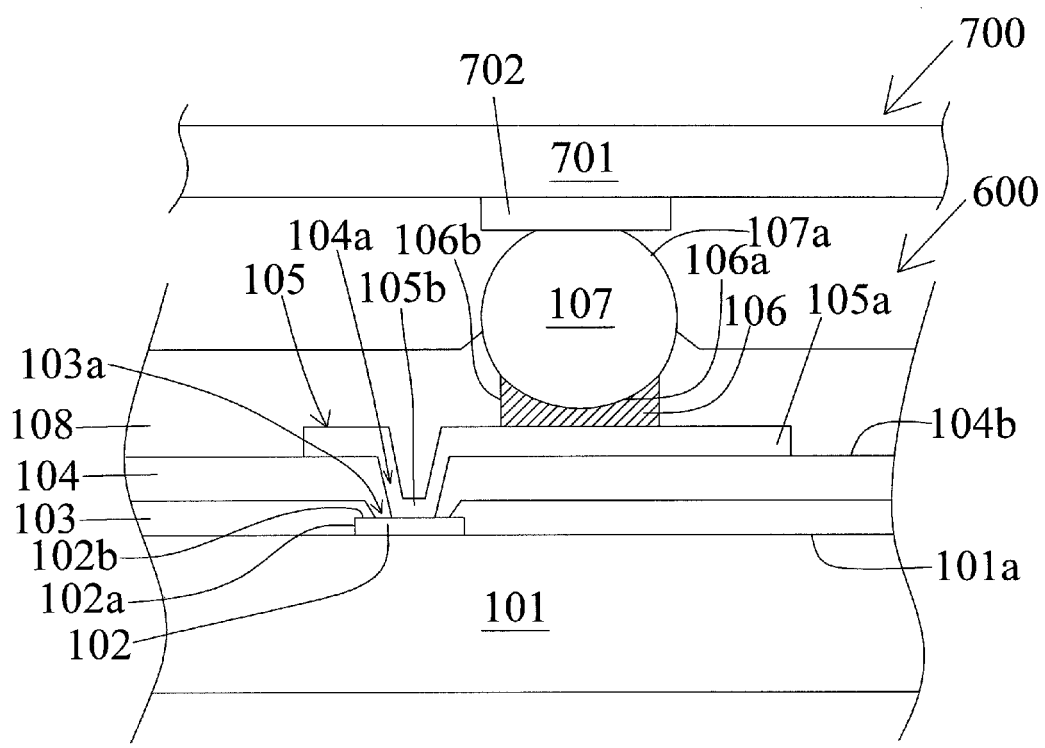
FIG. 6J is a schematic view of a substrate bonding with another substrate in accordance with some embodiments.

In some embodiments, the semiconductor structure 600 is bonded with another semiconductor structure 700 as in FIG. 6J. In some embodiments, the semiconductor structure 700 is a PCB or a semiconductor package. In some embodiments, the semiconductor structure 700 includes a substrate 701 including a circuitry and a bond pad 702 disposed on the substrate 701. In some embodiments, the bond pad 702 is disposed on or over a surface of the substrate 701.

In some embodiments, the conductive bump 107 of the semiconductor structure 600 is melted by heat treatment such as reflowing, and then the molten bump 107 is attached on the bond pad 702 of the semiconductor structure 700. As such, the conductive bump 107 is bonded with the bond pad 702 after cooling operations. Thus, the semiconductor structure 600 is mounted on the semiconductor structure 700, and the circuit of the substrate 701 is electrically connected with the circuit of the substrate 101 through the die pad 102, the PPI 105, the conductive bump 107 and the bond pad 702.

In the present disclosure, a semiconductor structure includes a metallic paste disposed on the PPI and served as a landing pad for a conductive bump to be disposed. The metallic paste is disposed at a predetermined position of the PPI by a stencil, then the conductive bump would be disposed on the metallic paste. As such, the conductive bump can be disposed at the predetermined position according to a position of the metallic paste. In addition, the metallic paste is configured to hold the conductive bump, and therefore, the conductive bump would maintain at the predetermined position of the PPI without shifting throughout subsequent operations such as reflowing, curing, etc. Shifting of the conductive bump is minimized and a reliability of the semiconductor structure is improved. Also, the metallic paste intermediate between the conductive bump and the PPI can minimize or avoid electron migration from the PPI to the conductive bump, and thus formation of void or development of cracks within the PPI can also be avoided.

In some embodiments, a method of manufacturing a semiconductor structure includes receiving a substrate including a die pad disposed thereon, disposing a passivation over the substrate and around the die pad, disposing a polymer over the passivation, forming a post passivation interconnect (PPI) including an elongated portion and a via portion contacting with the die pad, depositing a metallic paste on the elongated portion of the PPI by a stencil, disposing a conductive bump over the metallic paste, and disposing a molding over the PPI and around the metallic paste and the conductive bump.

In some embodiments, the depositing the metallic paste includes screen printing the metallic paste over the stencil. In some embodiments, the depositing the metallic paste includes sweeping across the semiconductor structure over the stencil by a blade to remove the overflown metallic paste. In some embodiments, the stencil includes an aperture corresponding to a predetermined position of the elongated portion of the PPI. In some embodiments, the conductive bump is disposed by the stencil. In some embodiments, the method further includes curing the metallic paste to form a concavity for receiving the conductive bump.

In some embodiments, the metallic paste includes a metal and an adhesive. In some embodiments, the method further includes curing the semiconductor structure before or after disposing the conductive bump. In some embodiments, the disposing the passivation includes forming a first opening above the die pad, and the via portion is disposed within the first opening. In some embodiments, the disposing the polymer includes forming a second opening above the die pad, and the via portion is disposed within the second opening.

In some embodiments, a method of manufacturing a semiconductor structure includes receiving a substrate including a passivation disposed over the substrate and a die pad exposed from the passivation, disposing a polymer over the passivation, forming a post passivation interconnect (PPI) electrically connected to the die pad, placing a stencil on the PPI, filling an aperture of the stencil by a metallic paste, disposing a conductive bump on the metallic paste, removing the stencil, and disposing a molding over the PPI and around the metallic paste and the conductive bump.

In some embodiments, the aperture of the stencil is configured for receiving the metallic paste or the conductive bump. In some embodiments, the stencil is placed on the PPI during the filling of the metallic paste and the disposing of the conductive bump. In some embodiments, the aperture of the stencil is completely filled with the metallic paste by removing the metallic paste overflown from the opening.

In some embodiments, a semiconductor structure includes a substrate, a die pad disposed over the substrate, a passivation surrounding an edge of the die pad, a polymer disposed over the passivation, a post passivation interconnect (PPI) including an elongated portion and a via portion contacted with the die pad, a metallic paste disposed on the elongated portion, a conductive bump disposed over the metallic paste, and a molding surrounding the conductive bump and the metallic paste, wherein the metallic paste includes a concavity for receiving the conductive bump, and the molding covers the metallic paste.

In some embodiments, the concavity of the metallic paste is conformal to a portion of an outer surface of the conductive bump. In some embodiments, a diameter of the conductive bump is substantially same as a width of an interface between the metallic paste and the PPI. In some embodiments, the metallic paste is a mixture of a metal and an adhesive. In some embodiments, the metallic paste includes copper or nickel. In some embodiments, a thickness of the metallic paste is about 10 um to about 5 um.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
   receiving a substrate including a die pad disposed thereon;
   disposing a passivation over the substrate and around the die pad;
   disposing a polymer over the passivation;
   forming a post passivation interconnect (PPI) including an elongated portion and a via portion contacting with the die pad;
   depositing a metallic paste on the elongated portion of the PPI by a stencil including an aperture corresponding to a predetermined position of the elongated portion of the PPI;
   disposing a conductive bump over the metallic paste; and
   disposing a molding over the PPI and around the metallic paste and the conductive bump.

2. The method of claim 1, wherein the depositing the metallic paste includes screen printing the metallic paste over the stencil.

3. The method of claim 1, wherein the depositing the metallic paste includes sweeping across the semiconductor structure over the stencil by a blade to remove the overflown metallic paste.

4. The method of claim 1, wherein the aperture is configured to receive the metallic paste or the conductive bump.

5. The method of claim 1, wherein the conductive bump is disposed by the stencil.

6. The method of claim 1, further comprising curing the metallic paste to form a concavity for receiving the conductive bump.

7. The method of claim 1, wherein the metallic paste includes a metal and an adhesive.

8. The method of claim 1, further comprising curing the semiconductor structure before or after disposing the conductive bump.

9. The method of claim 1, wherein the disposing the passivation includes forming a first opening above the die pad, and the via portion is disposed within the first opening.

10. The method of claim 1, wherein the disposing the polymer includes forming a second opening above the die pad, and the via portion is disposed within the second opening.

11. A method of manufacturing a semiconductor structure, comprising:
    receiving a substrate including a passivation disposed over the substrate and a die pad exposed from the passivation;
    disposing a polymer over the passivation;
    forming a post passivation interconnect (PPI) electrically connected to the die pad;
    placing a stencil on the PPI;
    filling an aperture of the stencil by a metallic paste;
    disposing a conductive bump on the metallic paste;
    removing the stencil; and
    disposing a molding over the PPI and around the metallic paste and the conductive bump.

12. The method of claim 11, wherein the aperture of the stencil is configured for receiving the metallic paste or the conductive bump.

13. The method of claim 11, wherein the stencil is placed on the PPI during the filling of the metallic paste and the disposing of the conductive bump.

14. The method of claim 11, wherein the aperture of the stencil is completely filled with the metallic paste by removing the metallic paste overflown from the opening.

15. A method of manufacturing a semiconductor structure, comprising:
    receiving a substrate including a die pad disposed thereon and a post passivation interconnect (PPI) disposed over the substrate, wherein the PPI includes an elongated portion and a via portion contacting with the die pad;
    placing a stencil over the PPI;
    depositing a metallic paste at a predetermined position of the elongated portion of the PPI by the stencil;
    disposing a conductive bump over the metallic paste; and
    disposing a molding around the conductive bump and the metallic paste.

16. The method of claim 15, wherein the disposing the conductive bump includes forming a concavity interfacing the metallic paste and the conductive bump, and the concavity is conformal to a portion of an outer surface of the conductive bump.

17. The method of claim 15, wherein the metallic paste is encapsulated by the conductive bump.

18. The method of claim 15, wherein the depositing the metallic paste includes forming the metallic paste with a width substantially same as or greater than a diameter of the conductive bump.

19. The method of claim 15, wherein the metallic paste is encapsulated by the molding, and the conductive bump is partially exposed from the molding.

20. The method of claim 15, wherein the conductive bump is held by the metallic paste.

* * * * *